United States Patent
Gardner et al.

[11] Patent Number: 5,888,880
[45] Date of Patent: Mar. 30, 1999

[54] TRENCH TRANSISTOR WITH LOCALIZED SOURCE/DRAIN REGIONS IMPLANTED THROUGH SELECTIVELY GROWN OXIDE LAYER

[75] Inventors: Mark I. Gardner, Cedar Creek; H. Jim Fulford, Jr.; Frederick N. Hause, both of Austin, all of Tex.

[73] Assignee: Advanced Micro Devices, Inc., Sunnyvale, Calif.

[21] Appl. No.: 739,596

[22] Filed: Oct. 30, 1996

[51] Int. Cl.⁶ .......................... H01L 21/265; H01L 21/00
[52] U.S. Cl. .......................... 438/424; 438/270; 438/282; 438/425
[58] Field of Search ........................ 438/270, 282, 438/424, 425, 151, 589, 431, 433, 439, 450, 451, 452

[56] References Cited

U.S. PATENT DOCUMENTS

| | | | |
|---|---|---|---|
| 4,745,086 | 5/1988 | Parillo et al. | 437/57 |
| 4,830,975 | 5/1989 | Bovaird et al. | 437/41 |
| 5,141,891 | 8/1992 | Arima et al. | 437/44 |
| 5,166,084 | 11/1992 | Pfiester | 437/40 |
| 5,175,118 | 12/1992 | Yoneda | 437/40 |
| 5,231,038 | 7/1993 | Yamaguchi et al. | 437/40 |
| 5,362,662 | 11/1994 | Ando et al. | 437/52 |
| 5,399,515 | 3/1995 | Davis et al. | 438/270 |
| 5,504,031 | 4/1996 | Hsu et al. | 437/57 |
| 5,512,506 | 4/1996 | Chang et al. | 437/44 |
| 5,538,913 | 7/1996 | Hong | 437/44 |
| 5,545,579 | 8/1996 | Liang et al. | 437/44 |
| 5,547,884 | 8/1996 | Yamaguchi et al. | 437/43 |
| 5,554,550 | 9/1996 | Yang | 437/43 |
| 5,567,635 | 10/1996 | Acovic et al. | 437/43 |
| 5,571,738 | 11/1996 | Krivokapic | 437/44 |
| 5,587,331 | 12/1996 | Jun | 437/41 |
| 5,610,091 | 3/1997 | Cho | 437/43 |
| 5,736,435 | 4/1998 | Venkatesan et al. | 438/282 |

Primary Examiner—Charles Bowers
Assistant Examiner—David S Blum
Attorney, Agent, or Firm—Skjerven, Morrill, MacPherson, Franklin & Friel, L.L.P.

[57] ABSTRACT

A method of forming an IGFET includes forming a trench with opposing sidewalls and a bottom surface in a substrate, selectively growing an oxide layer on the bottom surface so that the oxide layer includes a thick region between thin regions, implanting localized source and drain regions through the thin regions using the thick region as an implant mask, stripping the oxide layer, forming a gate insulator and gate electrode in the trench, and forming a source and drain in the substrate that include the localized source and drain regions adjacent to the bottom surface of the trench. The localized source and drain regions provide accurately positioned channel junctions beneath the trench. Furthermore, the locations and dopant concentrations of the localized source and drain regions are controlled by the dimensions of the selectively grown oxide layer.

43 Claims, 8 Drawing Sheets

TRENCH TRANSISTOR WITH LOCALIZED SOURCE/DRAIN REGIONS IMPLANTED THROUGH SELECTIVELY GROWN OXIDE LAYER

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and drain. The channel, source and drain are located in a semiconductor substrate, with the channel being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally requires a corresponding decrease in the vertical dimensions. As IGFET vertical dimensions are reduced and the supply voltage remains constant (e.g., 3 V), the maximum lateral electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD as well as a substantially planar top surface. It is especially desirable that the IGFET have a channel length that can be significantly smaller than the minimum resolution of the available lithographic system.

SUMMARY OF THE INVENTION

The present invention provides an insulated-gate field-effect transistor (IGFET) with a gate electrode in a trench (i.e., a trench transistor) and localized source and drain regions adjacent to a bottom surface of the trench. A gate insulator is disposed on the bottom surface of the trench, and the gate electrode in the trench is disposed on the gate insulator. Preferably, the localized source and drain regions define a channel beneath the trench that is substantially aligned with the bottom surface of the gate electrode. If the trench length corresponds to the minimum resolution of a lithographic system, then the channel length is significantly smaller than the minimum resolution. Furthermore, the gate electrode is substantially aligned with the top surface of the substrate, and substantially all of the gate electrode is within the trench. In this manner, a highly miniaturized IGFET can be produced.

A key feature of the invention is the selective growth of an oxide layer on the bottom surface of the trench so that the oxide layer includes a thick region between thin regions, followed by implantation of the localized source and drain regions through the thin regions using the thick region as an implant mask.

According to one aspect of the invention, a method of forming an IGFET includes forming a trench with opposing sidewalls and a bottom surface in a substrate, selectively growing an oxide layer on the bottom surface so that the oxide layer includes a thick region between thin regions, implanting localized source and drain regions through the thin regions using the thick region as an implant mask, forming a gate electrode in the trench, and forming a source and drain in the trench wherein the source includes the localized source region adjacent to the bottom surface and the drain includes the localized drain region adjacent to the bottom surface.

The method may include forming first spacers in the trench on the oxide layer to selectively expose the oxide layer, applying thermal oxidation to selectively grow the oxide layer, stripping the first spacers, implanting the localized source and drain regions, removing the oxide layer, forming second spacers and a gate insulator in the trench, and forming the gate electrode on the second spacers and gate insulator so that the gate electrode is electrically isolated from the substrate.

Preferably, the source and drain include sidewall source and drain regions adjacent to the sidewalls of the trench and extending between the top surface of the substrate and the bottom surface of the trench. The sidewall source and drain regions can be implanted before, simultaneously with, or after implanting the localized source and drain regions. Likewise, the sidewall source and drain regions can be implanted before or after the trench is formed, and to a greater or lesser depth than the trench. It is also preferred that the localized source and drain regions are lightly doped, and the sidewall source and drain regions are heavily doped, to provide an LDD structure. The localized source and drain regions can define channel junctions that are substantially aligned with the bottom surface of the gate electrode. The gate electrode can be formed by depositing a blanket layer of gate electrode material over the substrate, and then polishing the gate electrode material until the gate electrode is substantially aligned with a planar top surface of the substrate. As exemplary materials, the gate electrode is polysilicon, the gate insulator is silicon dioxide, the first spacers are silicon nitride, and the second spacers are silicon dioxide.

A first embodiment of the method includes providing a P-type substrate, implanting an N+ doped layer into the substrate using a heavy dose of ions, patterning a photoresist layer over the substrate, etching a trench defined by an opening in the photoresist layer completely through the doped layer and partially through the substrate thereby splitting the doped layer into N+ sidewall source and drain regions, stripping the photoresist layer, forming an oxide layer on opposing sidewalls and a bottom surface of the trench, forming nitride spacers in the trench that cover outer portions of the oxide layer on the bottom surface and expose a central portion of the oxide layer on the bottom surface, selectively growing the oxide layer by applying thermal oxidation so that the oxide layer includes a thick region between thin regions on the bottom surface, stripping the nitride spacers, implanting N− localized source and drain regions through the thin regions using a light dose of ions and the thick region as an implant mask, stripping the oxide layer, forming oxide spacers on the opposing sidewalls of the trench, growing a gate oxide on a central portion of the bottom surface of the trench between the oxide spacers, depositing a polysilicon layer over the substrate, polishing the polysilicon layer to form a polysilicon gate electrode within the trench and substantially aligned with the top surface of the substrate, and applying a high-temperature anneal to form the source and drain by activating and merging the localized and sidewall source and drain regions.

A second embodiment of the method includes providing a P-type substrate, patterning a photoresist layer over the substrate, etching a trench defined by an opening in the photoresist layer partially through the substrate, stripping the photoresist layer, forming an oxide layer on opposing sidewalls and a bottom surface of the trench, forming nitride spacers in the trench that cover outer portions of the oxide layer on the bottom surface and expose a central portion of the oxide layer on the bottom surface, selectively growing the oxide layer by applying thermal oxidation so that the oxide layer includes a thick region between thin regions on the bottom surface, stripping the nitride spacers, implanting N− localized source and drain regions through the thin regions using a light dose of ions and the thick region as an implant mask, stripping the oxide layer, forming oxide spacers on the opposing sidewalls of the trench, growing a gate oxide on a central portion of the bottom surface of the trench between the oxide spacers, depositing a polysilicon layer over the substrate, polishing the polysilicon layer to form a polysilicon gate electrode within the trench and substantially aligned with the top surface of the substrate, implanting N+ sidewall source and drain regions using a heavy dose of ions with the polysilicon gate electrode and oxide spacers as an implant mask for the bottom surface, and applying a high-temperature anneal to form the source and drain by activating and merging the localized and sidewall source and drain regions.

A primary advantage of the invention is that the IGFET can have a channel length that is significantly smaller than the minimum resolution of the available lithographic system, thereby providing a next generation transistor with the present generation lithography. In addition, the gate electrode is substantially aligned with the top surface of the substrate. Furthermore, the localized source and drain regions provide accurately positioned channel junctions, and the locations and dopant concentrations of the localized source and drain regions are controlled by the dimensions of the selectively grown oxide layer.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1A:
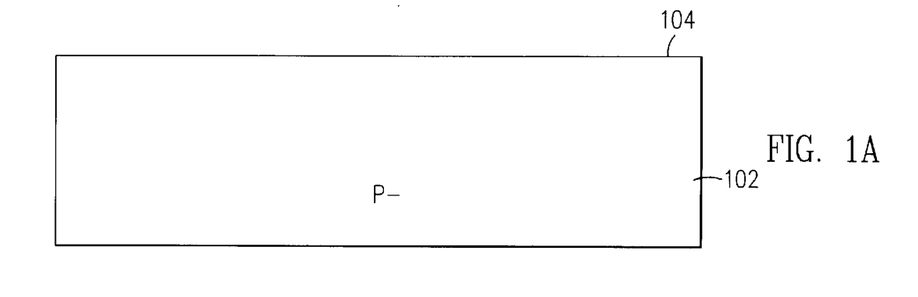
FIGS. 1A–1P show cross-sectional views of successive process steps for forming an IGFET with a gate electrode in a trench and localized source and drain regions beneath the trench in accordance with a first embodiment of the invention.
Figure 1B:
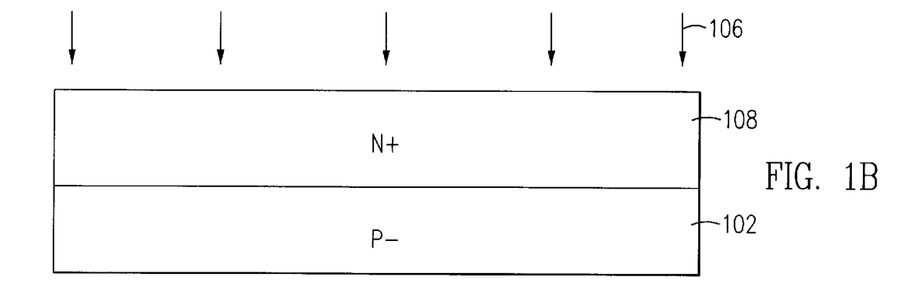
Figure 1C:
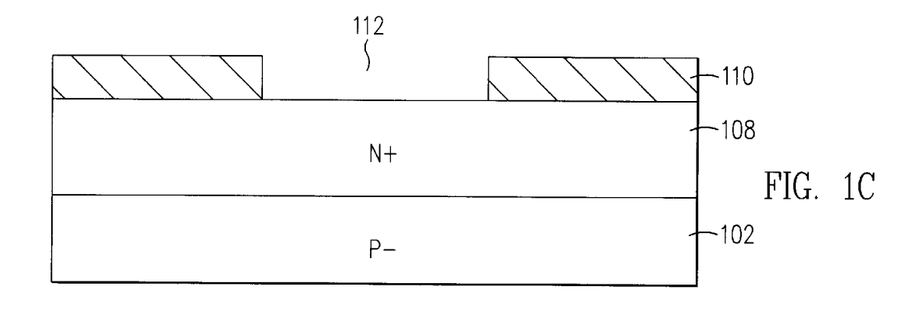
Figure 1D:
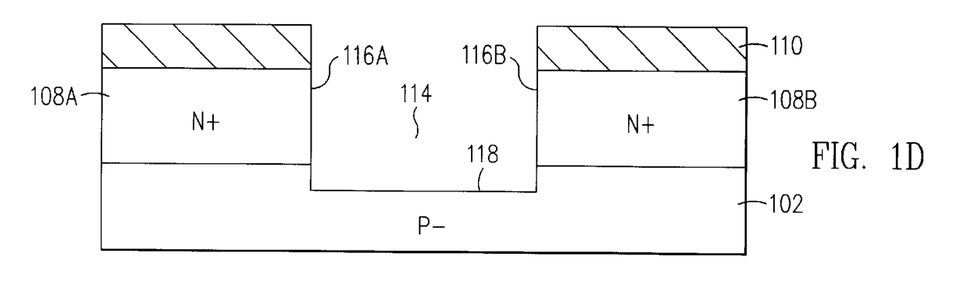
Figure 1E:
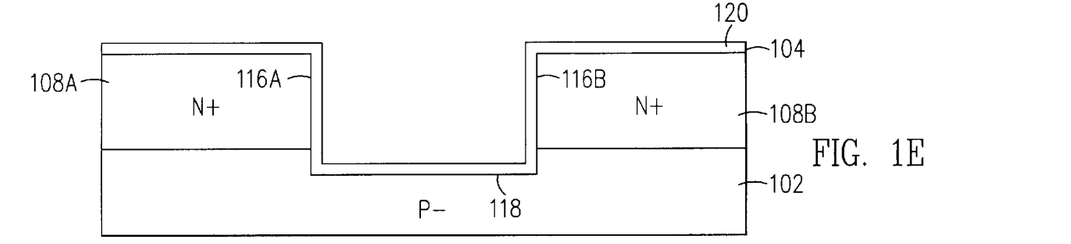
Figure 1F:
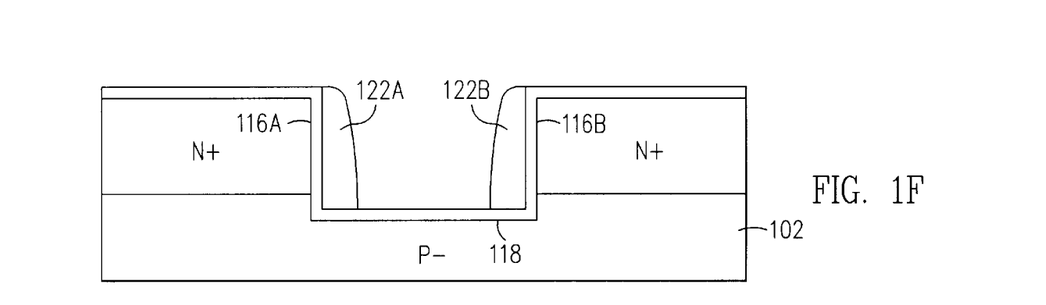
Figure 1G:
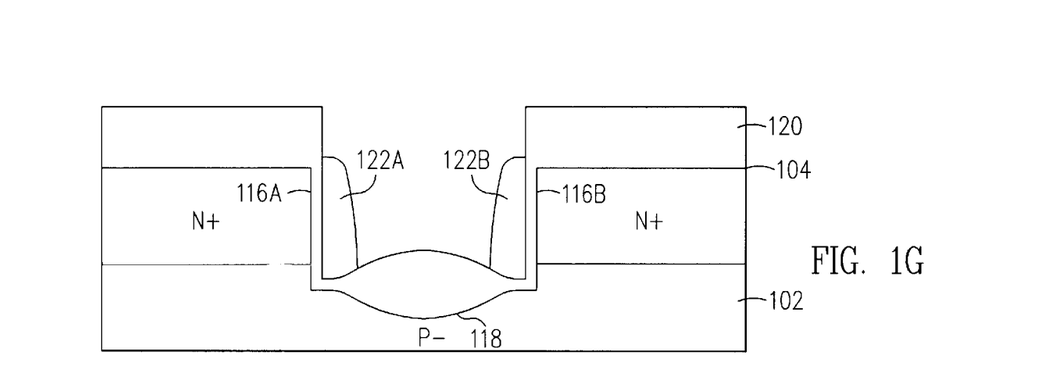
Figure 1H:
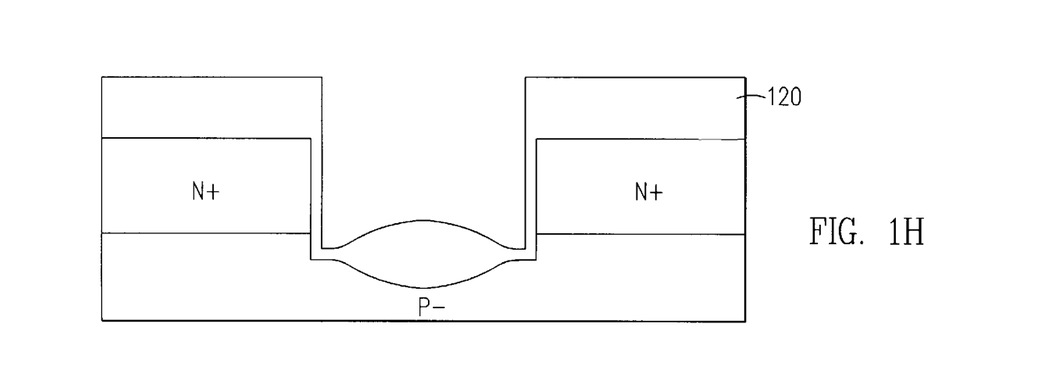
Figure 1I:
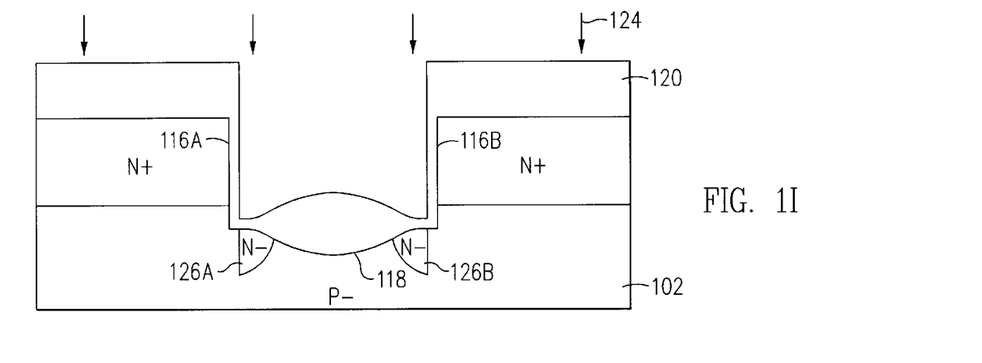
Figure 1J:
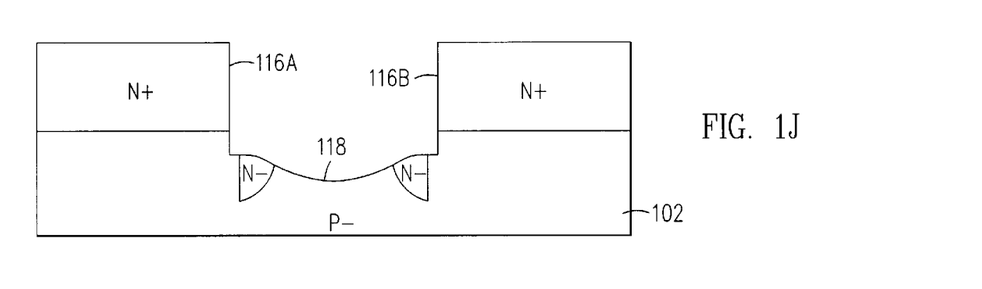
Figure 1K:
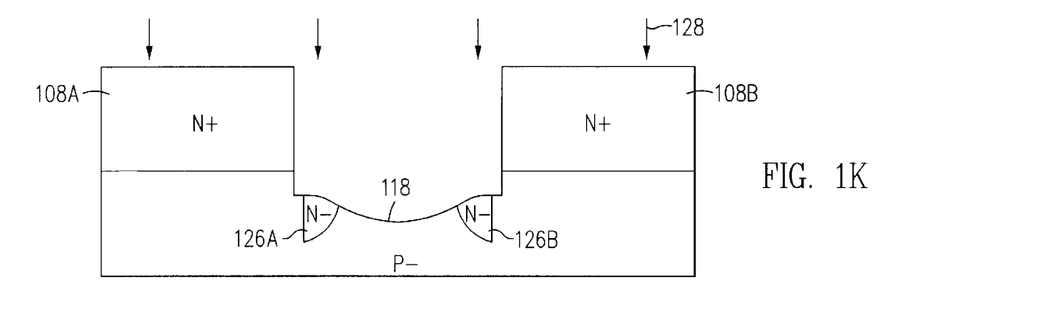
Figure 1L:
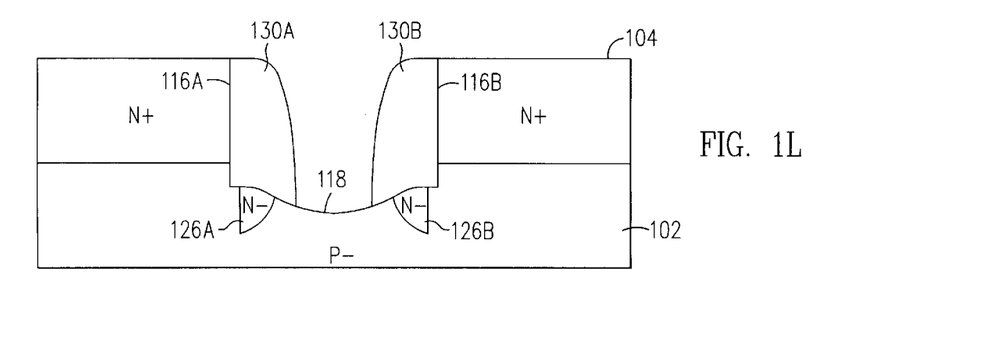
Figure 1M:
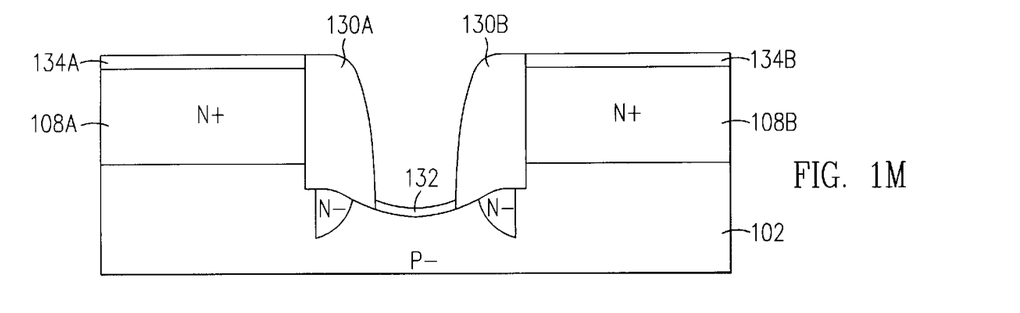
Figure 1N:
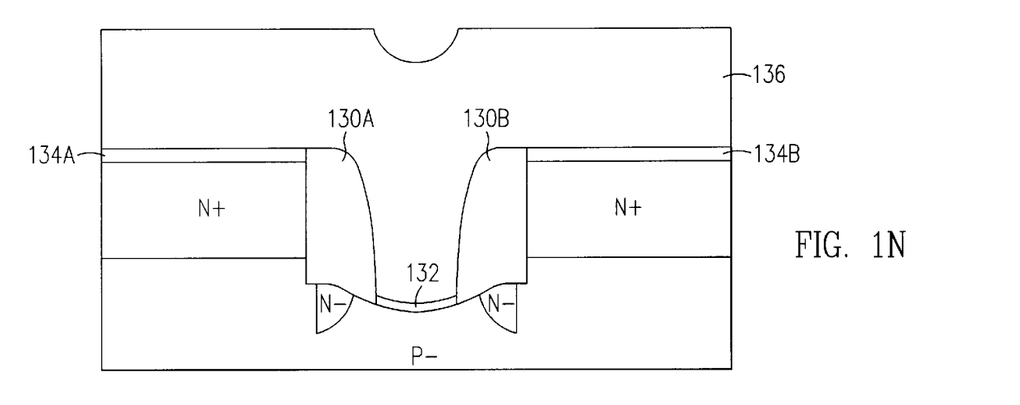
Figure 1O:
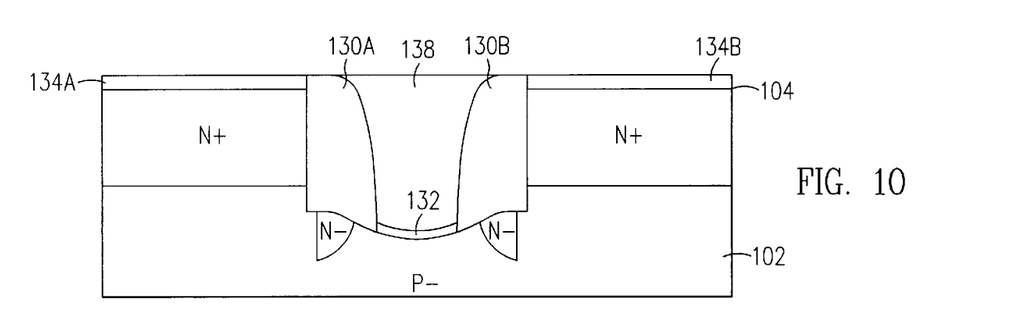
Figure 1P:
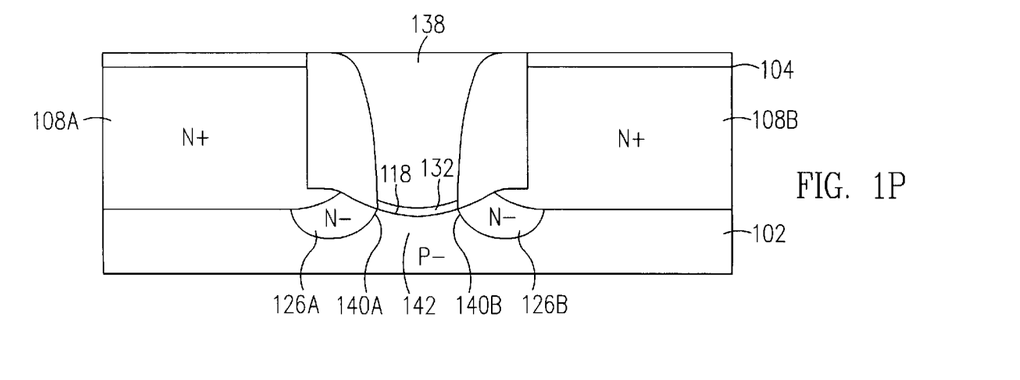

FIGS. 1A–1P show cross-sectional views of successive process steps for forming an IGFET with a gate electrode in a trench and localized source and drain regions beneath the trench in accordance with a first embodiment of the invention.

In FIG. 1A, semiconductor substrate 102 suitable for integrated circuit manufacture is provided. Substrate 102 includes a P– epitaxial surface layer with a <100> orientation, a boron concentration of $1\times10^{15}$ atoms/cm$^3$ and a resistivity of 12 ohm-cm. Preferably, the epitaxial surface layer is disposed on a P+ base layer (not shown). The epitaxial surface layer has a planar top surface 104.

In FIG. 1B, substrate 102 is subjected to ion implantation of arsenic, indicated by arrows 106, at a heavy dosage in the range of $1\times10^{15}$ to $5\times10^{15}$ atoms/cm$^2$ and an energy in the range of 2 to 80 kiloelectron-volts. This forms N+ doped layer 108 with an arsenic concentration in the range of $1\times10^{20}$ to $1\times10^{21}$ atoms/cm$^3$ and a depth of 1800 angstroms beneath top surface 104.

In FIG. 1C, photoresist layer 110 is deposited as a continuous layer on top surface 104 and then selectively irradiated using a photolithographic system, such as a step and repeat optical projection system, in which I-line ultra-violet light from a mercury-vapor lamp is projected through a reticle and a focusing lens to project the desired image pattern on photoresist layer 110. Thereafter, photoresist layer 110 is developed and the irradiated portions are removed to provide opening 112 that defines the lateral boundaries for a trench. The minimum resolution (i.e. linewidth and spacing) of the step and repeat system is 4000 angstroms (0.4 microns). Therefore, to reduce feature sizes, the length of opening 112 is 4000 angstroms.

In FIG. 1D, an anisotropic etch provided by a reactive ion etch is applied using photoresist layer 110 as an etch mask. The etch removes an upper portion of substrate 102 beneath opening 112 to form trench 114 completely through doped layer 108 and partially through substrate 102. Trench 114 includes opposing vertical sidewalls 116A and 116B, and planar bottom surface 118. Trench 114 has a depth (or height) of 2000 angstroms between top surface 104 and bottom surface 118, and a length of 4000 angstroms between sidewalls 116A and 116B. Trench 114 extends 200 angstroms beneath doped layer 108 and splits doped layer 108 into sidewall source region 108A and sidewall drain region 108B. Sidewall source region 108A is adjacent to sidewall 116A, and sidewall source region 108B is adjacent to sidewall 116B, however sidewall source region 108A and sidewall drain region 108B are spaced from bottom surface 118.

In FIG. 1E, photoresist 110 is stripped, and a blanket layer of silicon dioxide ($SiO_2$) is conformally deposited by chemical vapor deposition to form oxide layer 120 on substrate 102. Oxide layer 120 has a thickness of 100 angstroms. As is seen, oxide layer 120 covers sidewalls 116A and 116B, bottom surface 118, and top surface 104.

In FIG. 1F, a blanket layer of silicon nitride ($Si_3N_4$) that is 2500 angstroms thick is conformally deposited over substrate 102, and then an anisotropic etch provided by a reactive ion etch is applied to form nitride spacers 122A and 122B in trench 114. The spacer etch is highly selective of silicon nitride with respect to silicon dioxide, so only a negligible amount of oxide layer 120 is removed. Nitride spacers 122A and 122B extend to the top surface of oxide layer 120 over top surface 104. Nitride spacers 122A and 122B contact and cover outer portions of oxide layer 120 on bottom surface 118, as well as sidewall portions of oxide layer 120 on sidewalls 116A and 116B, but leave exposed a central portion of oxide layer 120 between and adjacent to the outer portions of oxide layer 120. Nitride spacers 122A and 122B each have a length of 900 angstroms along the outer portions of oxide layer 120. Therefore, the central portion of oxide layer 120 has a length of 2000 angstroms (4000–1800–200 angstroms), and is spaced from sidewalls 116A and 116B by 1000 angstroms.

The nitride spacer dimensions depend on several factors, including the height and length of the trench, the thickness of the oxide layer on the top surface of the substrate, the thickness of the nitride layer, and the duration of the spacer etch. The nitride spacer dimensions are based on the desired location and dopant concentration of localized source and drain region, as further described below.

In FIG. 1G, oxide layer 120 along bottom surface 118 is selectively grown by applying thermal oxidation. Oxide layer 120 grows not only at the central portion between nitride spacers 122A and 122B, but also beneath the outer edges of nitride spacers 122A and 122B since some of the oxidant diffuses laterally. As a result, the outer portions of oxide layer 120 include "bird's beaks" that lift the outer edges of nitride spacers 122A and 122B. Nonetheless, the central portion of oxide layer 120 between nitride spacers 122A and 122B is thicker than the outer portions of oxide layer 120 beneath nitride spacers 122A and 122B. Oxide layer 120 has a maximum thickness along bottom surface 118, centered between sidewalls 116A and 116B, of 1200 angstroms, but remains 100 angstroms thick where the outer portions beneath nitride spacers 122A and 122B are adjacent to the sidewall portions. Furthermore, the thermal oxidation transforms the upper and lower surfaces of the central portion of oxide layer 120 from planar to rounded surfaces. Since 44% of the oxide growth occurs in substrate 102, bottom surface 118 includes a rounded indentation corresponding to oxide layer 120. In addition, the exposed portions of oxide layer 120 on top surface 104 grow to a far greater thickness (particularly since sidewall source and drain regions 108A and 108B are heavily doped), however the sidewall portions of oxide layer 120 covered by nitride spacers 122A and 122B exhibit little or no growth.

In FIG. 1H, nitride spacers 122A and 122B are stripped using a wet etch that is highly selective of silicon nitride with respect to silicon dioxide. As a result, oxide layer 120 is fully exposed.

In FIG. 1I, substrate 102 is subjected to ion implantation of arsenic, indicated by arrows 124, at a light dosage in the range of $1\times10^{13}$ to $5\times10^{14}$ atoms/cm$^2$ and an energy in the range of 2 to 80 kiloelectron-volts. Oxide layer 120 on top surface 104 provides an implant mask for sidewall source region 108A and sidewall drain region 108B. A thick region of oxide layer 120 along bottom surface 118 provides an implant mask for a first central portion of bottom surface 118, whereas the thin regions of oxide layer 120 along bottom surface 118 and adjacent to the thick region allow varying amounts of the arsenic ions impinging thereon to pass through first outer portions of bottom surface 118 (adjacent to the first central portion) to form localized source region 126A and localized drain region 126B in substrate 102. For illustration purposes, the thin regions of oxide layer 120 extend into the central portion of oxide layer 120 and have a maximum thickness of 500 angstroms where they are adjacent to the thick region, and the thick region has a minimum thickness of 500 angstroms where it is adjacent to the thin regions. Localized source region 126A and localized drain region 126B are adjacent to the first outer portions of bottom surface 118, substantially aligned with the sidewall portions of oxide layer 120, and are doped N– with an arsenic concentration in the range of $5\times10^{17}$ to $5\times10^{18}$ atoms/cm$^3$. The quantity and energy of the arsenic that passes through the thin regions is proportional to the thickness of the thin regions. As a result, the depths and dopant concentrations of localized source and drain regions 126A and 126B are graded. In particular, the depth and dopant concentration of localized source region 126A decrease as the lateral distance from sidewall 116A increases, and likewise, the depth and dopant concentration of localized drain region 126B decrease as the lateral distance from sidewall 116B increases. Localized source and drain regions 126A and 126B have a maximum depth of 1000 angstroms below bottom surface 118 where bottom surface 118 is adjacent to the sidewall portions of oxide layer 120.

In FIG. 1J, oxide layer 120 is stripped using a wet etch that is highly selective of silicon dioxide with respect to silicon. Accordingly, sidewalls 116A and 116B and bottom surface 118 are fully exposed.

In FIG. 1K, a channel implant provided by boron, as indicated by arrows 128, is implanted through bottom surface 118. The channel implant includes a well implant, then a punchthrough implant, and then a threshold voltage implant. The well implant provides a more uniform background doping, the punchthrough implant provides the channel with greater robustness to punchthrough voltages, and the threshold voltage implant sets the threshold voltage of the IGFET to approximately 0.4 to 0.7 volts. The well implant is provided by boron at a dose in the range of $1\times10^{12}$ to $1\times10^{13}$ atoms/cm$^2$ and an energy in the range of 100 to 170 kiloelectron-volts, the punchthrough implant is provided by boron at a dose in the range of $1\times10^{12}$ to $1\times10^{13}$ atoms/cm$^2$ and an energy in the range of 40 to 100 kiloelectron-volts, and the threshold voltage implant is provided by boron at a dose in the range of $1\times10^{12}$ to $1\times10^{13}$ atoms/cm$^2$ and an energy in the range of 2 to 30 kiloelectron-volts. The channel implant beneath bottom surface 118 has a boron concentration on the order of $1\times10^{17}$ atoms/cm$^3$ and provides suitable doping for a channel adjacent to bottom surface 118. However, the channel implant has little effect on sidewall source and drain regions 108A and 108B, since they are already doped N+, and lacks sufficient P-type concentration to counterdope localized source and drain regions 126A and 126B.

In FIG. 1L, a blanket layer of silicon dioxide that is 3000 angstroms thick is conformally deposited over substrate 102, and then an anisotropic etch provided by a reactive ion etch is applied to form oxide spacers 130A and 130B in trench 114. The spacer etch is highly selective of silicon dioxide with respect to silicon, and therefore removes only a negligible amount of substrate 102. Oxide spacers 130A and 130B contact and completely cover sidewalls 116A and 116B, respectively, as well as localized source and drain regions 126A and 126B, respectively, and extend to the top surface 104. Oxide spacers 130A and 130B also contact and cover second outer portions of bottom surface 118 adjacent to sidewalls 116A and 116B, but leave exposed a second central portion of bottom surface 118 between and adjacent to the second outer portions. Oxide spacers 130A and 130B each have a length of 1200 angstroms (as measured laterally from sidewalls 116A and 116B) along the second outer portions of bottom surface 118. Therefore, the second central portion of bottom surface 118 has a length of 1600 angstroms (4000–2400 angstroms), and is spaced from sidewalls 116A and 116B by 1200 angstroms. The second central portion of bottom surface 118 will be substantially aligned with a channel between localized source and drain regions 126A and 126B, as further described below.

The oxide spacer dimensions depend on several factors, including the height and length of the trench, the thickness of the conformal spacer oxide layer, and the duration of the spacer etch. The oxide spacer dimensions are selected to provide the desired scaling of the trench length to the channel length. However, the channel length depends on other factors including the characteristics of the localized source and drain regions and a subsequent high-temperature anneal. Preferably, the channel length is scaled to less than half of the trench length, and is less than 2000 angstroms.

In FIG. 1M, a high quality layer of silicon dioxide is thermally grown on the exposed silicon surfaces using tube growth at a temperature of 700° to 1000° C. in an O$_2$ containing ambient. As a result, gate oxide 132 with a thickness of 50 angstroms is formed on the second central portion of bottom surface 118, and oxide segments 134A and 134B with a substantially greater thickness are formed on top surface 104. The heights of oxide spacers 130A and 130B increase as well. Oxide segments 134A and 134B are thicker than gate oxide 132 due to the heavy doping of arsenic in sidewall source and drain regions 108A and 108B, respectively. Oxide segments 134A and 134B, oxide spacers 130A and 130B, and gate oxide 132 form a continuous oxide layer on substrate 102.

In FIG. 1N, a blanket layer of undoped polysilicon 136 with a thickness of 4000 angstroms is deposited by low pressure chemical vapor deposition over substrate 102. Thus, polysilicon 136 is deposited on oxide spacers 130A and 130B, on gate oxide 132, and on oxide segments 134A and 134B. Polysilicon 136 fills the remaining space in trench 114. Thereafter, polysilicon 136 is doped by subjecting the structure to ion implantation of arsenic at a heavy dose in the range of $1\times10^{15}$ to $5\times10^{15}$ atoms/cm$^2$ and an energy in the range of 2 to 80 kiloelectron-volts. Polysilicon 136 is thick enough to prevent the arsenic from passing through to the underlying structure.

In FIG. 1O, the structure is planarized by applying chemical-mechanical polishing in the presence of an abrasive slurry that is highly selective of polysilicon with respect to silicon dioxide. The polishing grinds down polysilicon 136, oxide spacers 130A and 130B and oxide segments 134A and 134B above top surface 104, and then is discontinued using oxide spacers 130A and 130B and oxide segments 134A and 134B as a stop-layer. The remaining portion of polysilicon 136 forms polysilicon gate electrode 138. As is seen, the top surfaces of oxide spacers 130A and 130B, oxide segments 134A and 134B, and polysilicon gate electrode 138 are aligned and form a planar surface. Polysilicon gate electrode 138 extends merely 50 angstroms above top surface 104, and therefore is substantially aligned with top surface 104. All of polysilicon gate 138 is within the length of trench 114, and substantially all of polysilicon gate electrode 138 is within trench 114. Of importance, polysilicon gate electrode 138 is spaced from substrate 102 by oxide spacers 130A and 130B and gate oxide 132. No portion of polysilicon gate electrode 138 contacts substrate 102 or overlaps top surface 104.

In FIG. 1P, a rapid thermal anneal on the order of 950° to 1050° C. for 10 to 30 seconds is applied to remove crystalline damage and to activate and drive-in the implanted dopants. The implanted arsenic diffuses into substrate 102 both laterally and vertically. In particular, sidewall source region 108A and sidewall drain region 108B diffuse slightly beneath bottom surface 118. As a result, source regions 108A and 126A merge to form a source, and drain regions 108B and 126B merge to form a drain. Accordingly, localized drain region 126B provides for a lightly doped drain. Furthermore, localized source region 108A and localized drain region 108B laterally diffuse to provide channel junctions 140A and 140B, respectively. Channel junctions 140A and 140B define channel 142 that is substantially aligned with and adjacent to the central portion of bottom surface 118 and gate oxide 132. Moreover, channel junctions 140A and 140B are substantially aligned with and spaced from the bottom surface of polysilicon gate electrode 138. Channel 142 has a channel length of approximately 1600 angstroms. Sidewall source region 108A and sidewall drain region 108B extend to top surface 104 for receiving source/drain contacts. Accordingly, polysilicon gate electrode 138 controls an N-channel MOSFET with channel 142 between the source and drain.

Figure 2A:
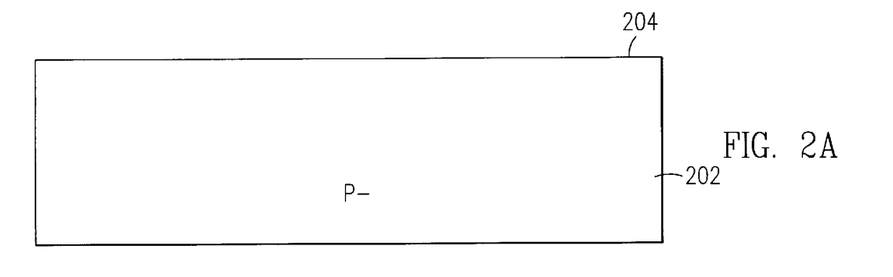
FIGS. 2A–2P show cross-sectional views of successive process steps for forming an IGFET with a gate electrode in a trench and localized source and drain regions beneath the trench in accordance with a second embodiment of the invention.
Figure 2B:
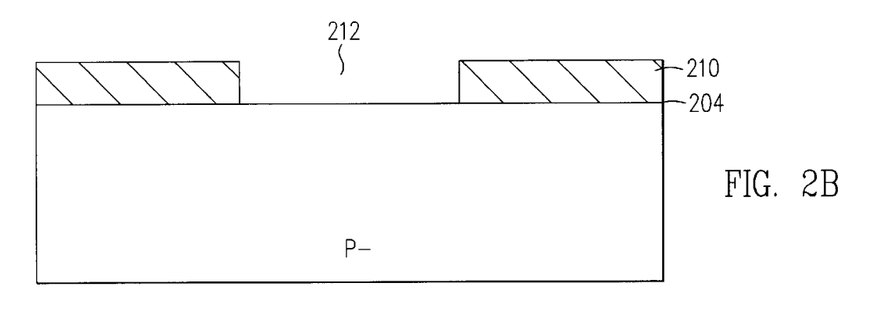
Figure 2C:
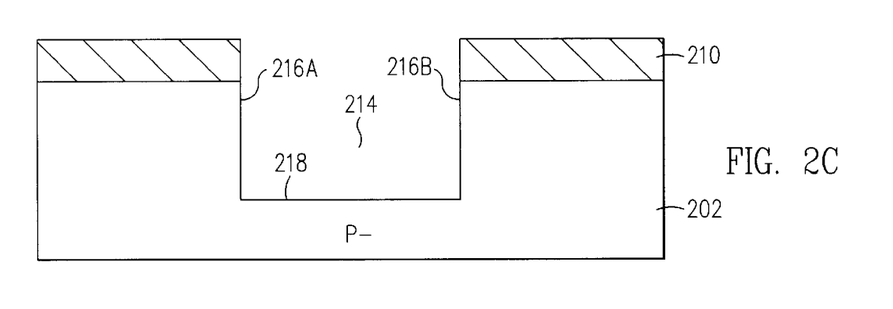
Figure 2D:
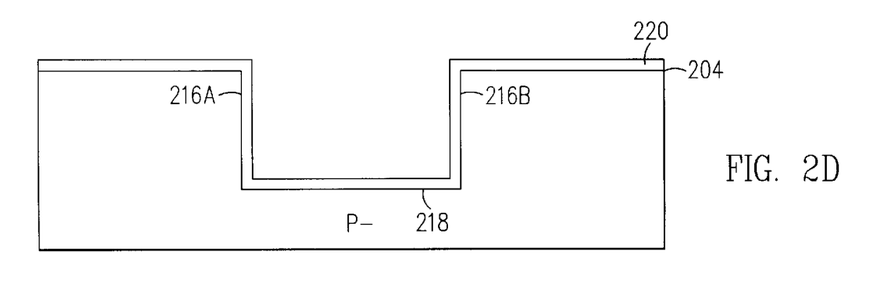
Figure 2E:
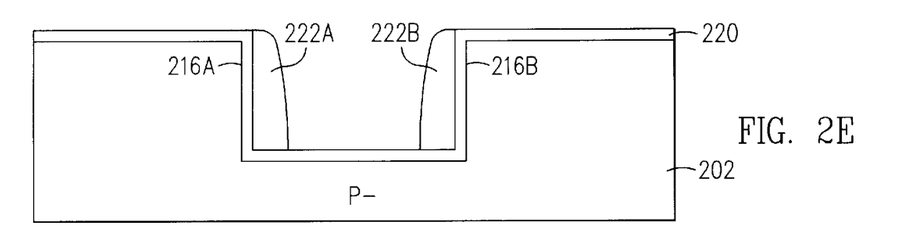
Figure 2F:
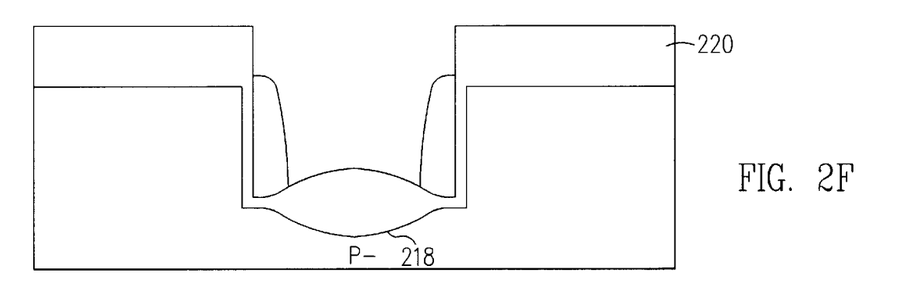
Figure 2G:
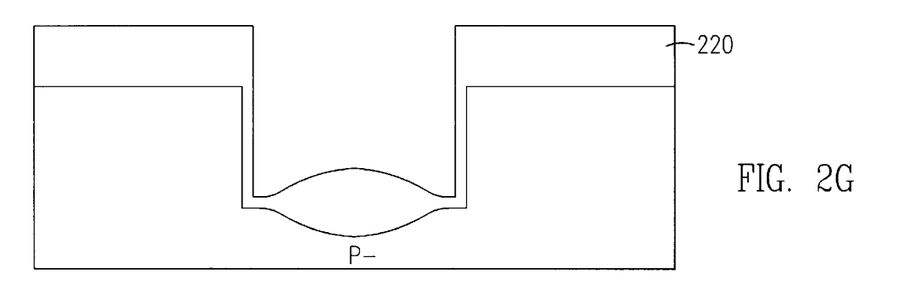
Figure 2H:
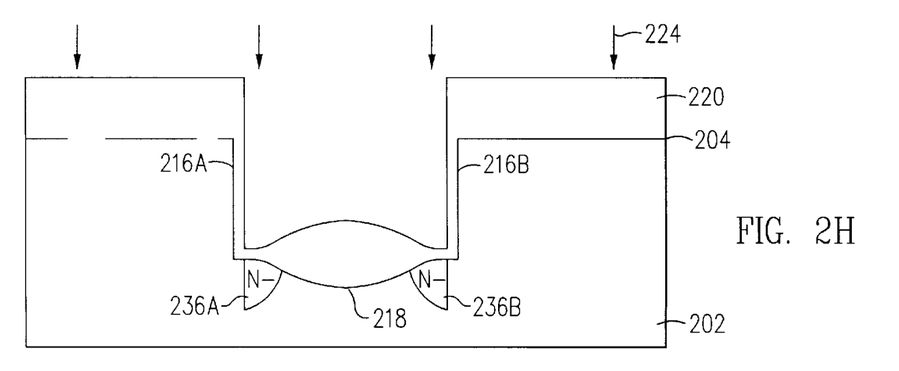
Figure 2I:
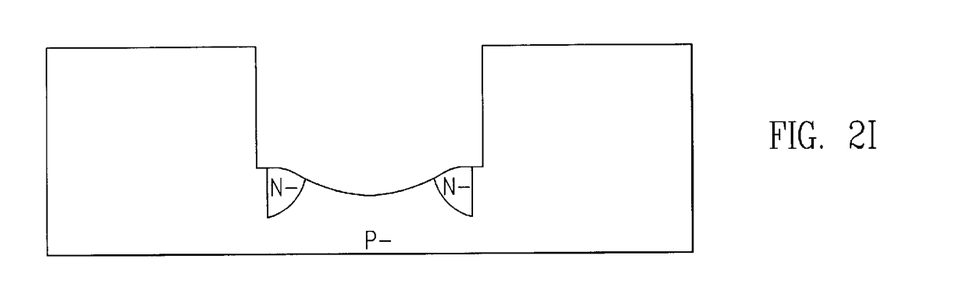
Figure 2J:
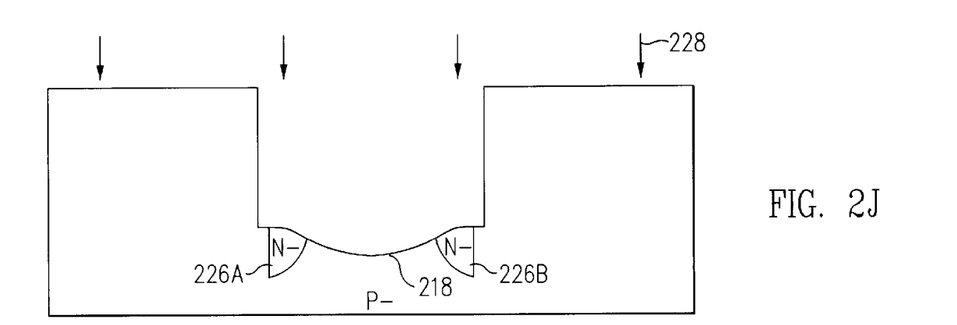
Figure 2K:
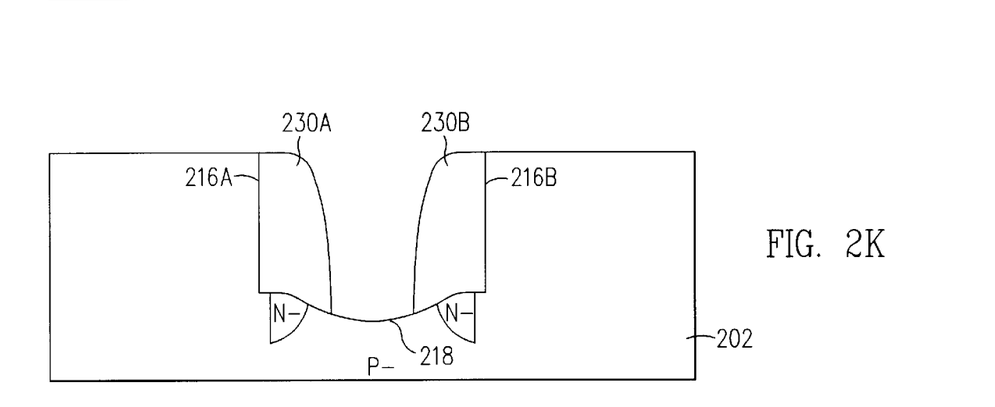
Figure 2L:
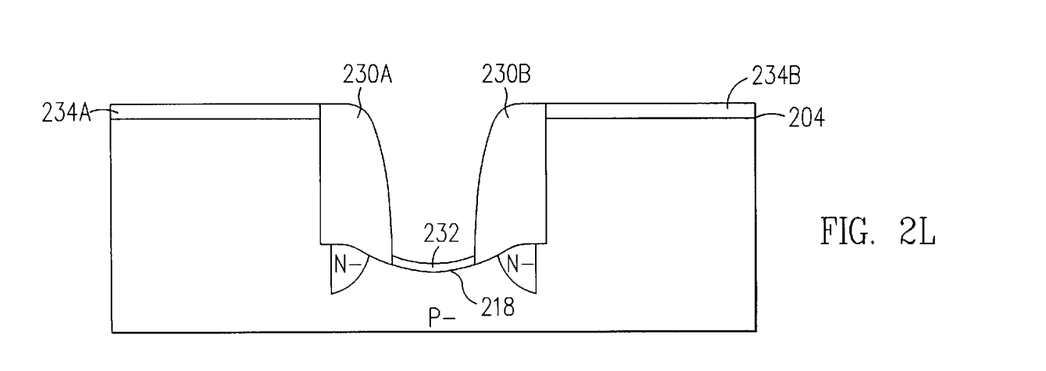
Figure 2M:
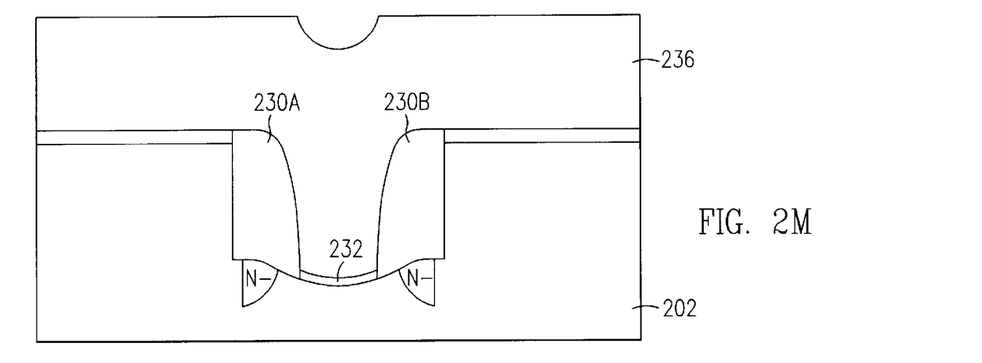
Figure 2N:
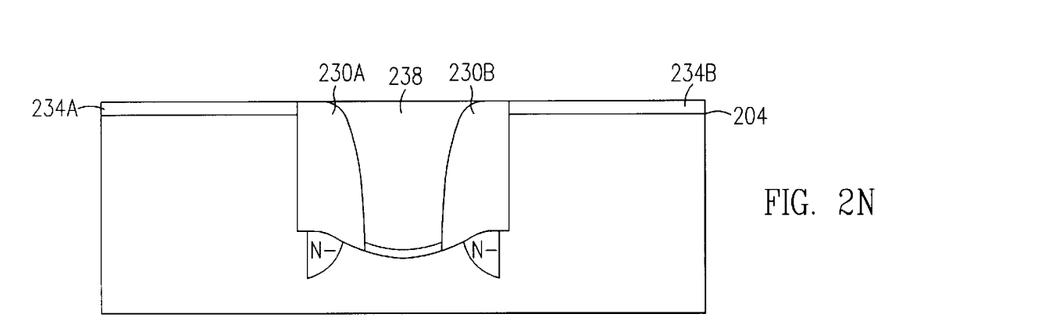
Figure 2O:
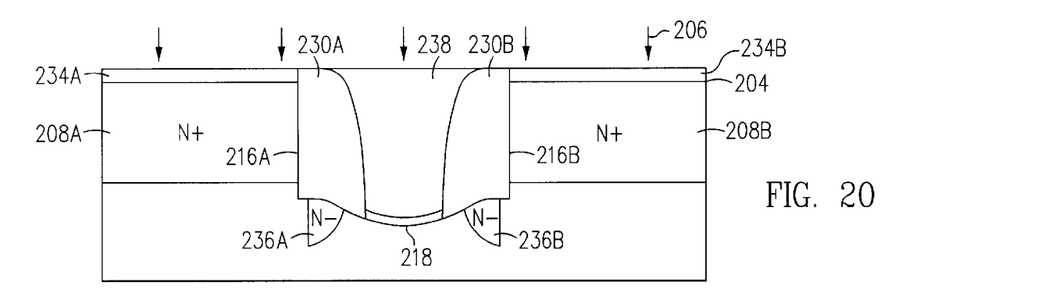
Figure 2P:
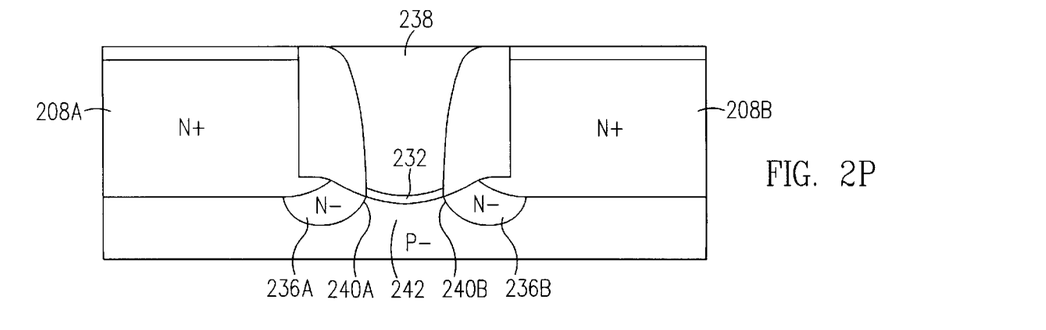

FIGS. 2A–2P show cross-sectional views of successive process steps for forming an IGFET with a gate electrode in a trench and localized source and drain regions beneath the trench in accordance with a second embodiment of the invention. In the first embodiment, three separate implant steps were used to dope the doped layer containing the sidewall source and drain regions, the polysilicon gate electrode, and the localized source and drain regions. Reducing the number of implant steps is desirable from an efficiency standpoint, particularly if the implantation provides lightly doped localized source and drain regions and heavily doped sidewall source and drain regions. The primary difference between the second embodiment and the first embodiment is that in the second embodiment, the localized and sidewall source and drain regions and the polysilicon gate electrode are doped using two implant steps instead of three. In particular, a first implant step provides lightly doped localized source and drain regions, and a second implant provides heavily doped sidewall source and drain regions and a heavily doped polysilicon gate electrode. Thus, the sidewall source and drain regions are implanted after implanting the localized source and drain regions. Unless otherwise noted, the elements for the second embodiment (e.g., substrate 202, gate oxide 232, etc.) are similar to elements of the first embodiment (e.g., substrate 102, gate oxide 132, etc.), and the description of related elements and process steps need not be repeated.

In FIG. 2A, semiconductor substrate 202 suitable for integrated circuit manufacture is provided. Substrate 202 includes a P– epitaxial surface layer with a boron concentration of $1 \times 10^{15}$ atoms/cm$^3$ and planar top surface 204.

In FIG. 2B, photoresist layer 210 is deposited as a continuous layer on top surface 204 and then selectively irradiated using a step and repeat system. Thereafter, photoresist layer 210 is developed and the irradiated portions are removed to provide opening 212 that defines the lateral boundaries for a trench. The length of opening 212 is 4000 angstroms.

In FIG. 2C, an anisotropic etch is applied using photoresist layer 210 as an etch mask to form trench 214 partially through substrate 202. Trench 214 includes opposing vertical sidewalls 216A and 216B, and planar bottom surface 218. Trench 214 has a depth (or height) of 2000 angstroms between top surface 204 and bottom surface 218, and a length of 4000 angstroms between sidewalls 216A and 216B.

In FIG. 2D, photoresist layer 210 is stripped, and a blanket layer of silicon dioxide is conformally deposited by chemical vapor deposition to form oxide layer 220 on substrate 202. Oxide layer 220 has a thickness of 100 angstroms and covers top surface 204, sidewalls 216A and 216B, and bottom surface 218.

In FIG. 2E, a blanket layer of silicon nitride that is 2500 angstroms thick is conformally deposited over substrate 202, and then an anisotropic etch is applied to form nitride spacers 222A and 222B adjacent to oxide layer 220 on sidewalls 216A and 216B, respectively. Nitride spacers 222A and 222B cover outer portions of oxide layer 220 while exposing a central portion of oxide layer 220.

In FIG. 2F, oxide layer 220 along bottom surface 218 is selectively grown by applying thermal oxidation. As a result, the central portion of oxide layer 220 along bottom surface 218 is thicker than the outer portions of oxide layer 220 along bottom surface 218. The central portion also has rounded upper and lower surfaces.

In FIG. 2G, nitride spacers 222A and 222B are stripped, thereby fully exposing oxide layer 220.

In FIG. 2H, substrate 202 is subjected to ion implantation of arsenic, indicated by arrows 224, at a light dosage in the range of $1 \times 10^{13}$ to $5 \times 10^{14}$ atoms/cm$^2$ and an energy in the range of 2 to 80 kiloelectron-volts. Oxide layer 220 on top surface 204 provides an implant mask for substrate 202 outside trench 214. A thick region of oxide layer 220 along bottom surface 218 provides an implant mask for a first central portion of bottom surface 218, whereas thin regions of oxide layer 220 along bottom surface 218 allow varying amounts of the arsenic ions impinging thereon to pass through first outer portions of bottom surface 218 to form localized source region 226A and localized source region 226B in substrate 202. Localized source region 226A and localized drain region 226B are adjacent to the first outer portions of bottom surface 218, substantially aligned with the sidewall portions of oxide layer 220, and are doped N– with an arsenic concentration in the range of $5 \times 10^{17}$ to $5 \times 10^{18}$ atoms/cm$^3$. Since the amount of arsenic that passes through the thin regions is proportional to the thickness of the thin regions, the depths and dopant concentrations of localized source and drain regions 226A and 226B are graded and decrease with increasing lateral distance from sidewalls 216A and 216B, respectively.

In FIG. 2I, oxide layer 220 is stripped.

In FIG. 2J, a channel implant provided by boron, as indicated by arrows 228, is implanted through bottom surface 218. The channel implant includes a well implant, then a punchthrough implant, and then a threshold voltage implant. The channel implant has a boron concentration on the order of $1 \times 10^{17}$ atoms/cm$^3$ and provides suitable doping for a channel adjacent to bottom surface 218.

In FIG. 2K, a blanket layer of silicon dioxide that is 3000 angstroms thick is conformally deposited over substrate 202, and then an anisotropic etch is applied to form oxide spacers 230A and 230B adjacent to sidewalls 216A and 216B, respectively. Oxide spacers 230A and 230B cover second outer portions of bottom surface 218 while exposing a second central portion of bottom surface 218. Oxide spacers 230A and 230B each have a length of 1200 angstroms along bottom surface 218.

In FIG. 2L, gate oxide 232 with a thickness of 50 angstroms is thermally grown on the central portion of bottom surface 218, and oxide segments 234A and 234B are grown on top surface 204. Oxide segments 234A and 234B have similar thickness as gate oxide 232 since the sidewall source and drain regions have yet to be implanted. The heights of oxide spacers 230A and 230B increase as well.

In FIG. 2M, a blanket layer of undoped polysilicon 236 with a thickness of 4000 angstroms is deposited by low pressure chemical vapor deposition over substrate 202. Polysilicon 236 contacts oxide spacers 230A and 230B, gate oxide 232, and oxide segments 234A and 234B and fills the remaining space in trench 214.

In FIG. 2N, the structure is planarized by applying chemical-mechanical polishing in the presence of an abrasive slurry that is highly selective of polysilicon with respect to silicon dioxide. The polishing grinds down regions of polysilicon 236, oxide spacers 230A and 230B and oxide segments 234A and 234B but is discontintued before reaching top surface 204. The remaining portion of polysilicon 236 forms polysilicon gate electrode 238, which is aligned with oxide spacers 230A and 230B and oxide segments 234A and 234B. Polysilicon gate electrode 238, which extends slightly above top surface 204, is substantially aligned with top surface 204, and substantially all of polysilicon gate electrode 238 is within trench 214.

In FIG. 2O, substrate 202 is subjected to ion implantation of arsenic, indicated by arrows 206, at a heavy dosage in the range of $1 \times 10^{15}$ to $5 \times 10^{15}$ atoms/cm$^2$ and an energy in the range of 2 to 80 kiloelectron-volts. The arsenic implant provides heavy doping for sidewall source region 208A and sidewall drain region 208B in substrate 202, adjacent to top surface 204, adjacent to sidewalls 216A and 216B, respectively, and spaced from bottom surface 218. Sidewall source region 208A and sidewall drain region 208B are doped N+ with an arsenic concentration in the range of $1 \times 10^{20}$ to $1 \times 10^{21}$ atoms/cm$^3$ and a depth within 200 angstroms of bottom surface 218. Moreover, the arsenic implant also provides heavy doping for polysilicon gate electrode 238. During implantation, polysilicon gate electrode 238 and oxide spacers 230A and 230B provide an implant mask for all of bottom surface 218, so that localized source and drain regions 226A and 226B are unaffected and remain lightly doped.

In FIG. 2P, a rapid thermal anneal on the order of 950° to 1050° C. for 10 to 30 seconds is applied to remove crystalline damage and to activate and drive-in the implanted dopants. As a result, source regions 208A and 226A merge to form a source, and drain regions 208B and 226B merge to form a drain. Accordingly, localized drain region 226B provides for a lightly doped drain. Furthermore, channel junctions 240A and 240B define channel 242 that is substantially aligned with and adjacent to the second central portion of bottom surface 218 and gate oxide 232, and is substantially aligned with and spaced from the bottom surface of polysilicon gate electrode 238. Channel 242 has a length of approximately 1600 angstroms. Sidewall source region 208A and sidewall drain region 208B extend to top surface 204 for receiving source/drain contacts. Accordingly, polysilicon gate electrode 238 controls an N-channel MOSFET with channel 242 between the source and drain As yet another embodiment, the localized and sidewall source and drain regions can be implanted simultaneously. For instance, as a variation to the second embodiment, a method includes reducing the thickness of the oxide layer over the top surface (such as by polishing) after selectively growing the oxide layer, implanting the localized and sidewall source and drain regions in a single step, stripping the oxide layer, forming the oxide spacers, forming the gate oxide, providing a doped polysilicon layer, and then polishing the doped polysilicon layer to provide the polysilicon gate electrode.

Further processing steps in the fabrication of IGFETs typically include forming a thick oxide layer over the active regions, forming contact windows in the oxide layer above the source, drain and gate electrode, forming appropriate interconnect metallization in the contact windows, and then forming a passivation layer. In addition, either earlier or subsequent high-temperature process steps can be used to supplement or replace the high-temperature anneal to provide the desired anneal, activation, and diffusion for the implanted dopants. These further processing steps are conventional and need not be repeated herein. Likewise the principal processing steps disclosed herein may be combined with other steps readily apparent to those skilled in the art.

At completion of the process, it is preferred that the channel length be precisely controlled. However, to the extent that the lateral locations of the channel junctions are not (or can not be) precisely controlled, it is far preferable to have a slight overlap between the channel junctions and the bottom surface of the gate electrode as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source/drain involves a tradeoff between switching speed and drive current.

The present invention includes numerous variations to the embodiments described above. For instance, the sidewall source and drain regions can be implanted to a greater depth than the trench to facilitate merging the localized and sidewall source and drain regions. If desired, the localized source and drain regions can be heavily doped. The gate electrode can be various conductors such as aluminum, titanium, tungsten, cobalt, and combinations thereof, although the material may be limited by the use of subsequent high-temperature steps. The gate insulator can be various dielectrics. Suitable thermal oxidations for selectively growing the oxide layer include wet oxidations, dry oxidations, and high-pressure oxidations at reduced temperatures. Furthermore, the selectively grown oxide layer can be initially formed using blanket thermal oxidation. The first spacers can be various materials as long as the subsequent etch is highly selective to the first spacers with respect to the selectively grown oxide layer. Similarly, the second spacers (formed after the first spacers and the selectively grown oxide layer are stripped) can be various materials including oxides, nitrides, and oxynitrides. Suitable N-type dopants include arsenic and phosphorus; suitable P-type dopants include boron $B_{10}$, boron $B_{11}$, and $BF_x$ species such as $BF_2$.

Further details regarding trench transistors are disclosed in U.S. patent application Ser. No. 08/739,593 filed concurrently herewith, entitled "Trench Transistor With Metal Spacers" by Gardner et al.; U.S. patent application Ser. No. 08/739,595 filed concurrently herewith, entitled "Trench Transistor With Insulative Spacers" by Gardner et al.; U.S. patent application Ser. No. 08/739,592 filed concurrently herewith, entitled "Trench Transistor With Localized Source/Drain Regions Implanted Through Voids In Trench" by Gardner et al.; U.S. patent application Ser. No. 08/739, 597 filed concurrently herewith, entitled "Trench Transistor In Combination With Trench Array" by Fulford, Jr. et al.; U.S. patent application Ser. No. 08/739,566 filed concurrently herewith, entitled "Trench Transistor And Isolation Trench" by Gardner et al.; and U.S. patent application Ser. No. 08/739,567 filed concurrently herewith, entitled "Trench Transistor With Source Contact In Trench" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET, the method comprising the steps of:
   forming a trench with opposing sidewalls and a bottom surface in a substrate;
   selectively growing an oxide layer on the bottom surface so that the oxide layer includes a thick region between thin regions;
   implanting localized source and drain regions through the thin regions using the thick region as an implant mask;
   forming a gate electrode in the trench; and
   forming a source and a drain in the substrate, wherein the source includes the localized source region adjacent to the bottom surface of the trench and the drain includes the localized drain region adjacent to the bottom surface of the trench.

2. The method of claim 1, including:
   forming the oxide layer on the sidewalls and the bottom surface;
   forming nitride spacers in the trench on portions of the oxide layer adjacent to the sidewalls, wherein outer portions of the oxide layer on the bottom surface are beneath the nitride spacers and a central portion of the oxide layer on the bottom surface is between the nitride spacers and exposed; and then
   selectively growing the oxide layer by applying thermal oxidation.

3. The method of claim 2, wherein selectively growing the oxide layer causes the oxide layer to lift outer edges of the nitride spacers adjacent to the central portion of the oxide layer.

4. The method of claim 3, including removing the nitride spacers before implanting the localized source and drain regions.

5. The method of claim 1, including implanting the localized source and drain regions before forming the gate electrode.

6. The method of claim 5, including:
   removing the oxide layer after implanting the localized source and drain regions;
   forming a gate insulator on the bottom surface and forming spacers in the trench after removing the oxide layer; and
   forming the gate electrode on the gate insulator and the spacers, wherein the gate electrode is spaced from and electrically isolated from the substrate.

7. The method of claim 1, wherein forming the drain and the source includes implanting sidewall source and drain regions through a top surface of the substrate into portions of the substrate, and the sidewall source and drain regions are adjacent to the sidewalls.

8. The method of claim 7, including implanting the sidewall source and drain regions and the localized source and drain regions simultaneously.

9. The method of claim 7, including implanting the sidewall source and drain regions before implanting the localized source and drain regions.

10. The method of claim 7, including implanting the sidewall source and drain regions after implanting the localized source and drain regions.

11. The method of claim 7, wherein the localized source and drain regions are lightly doped regions, and the sidewall source and drain regions are heavily doped regions.

12. The method of claim 1, including forming a channel adjacent to the bottom surface of the trench and between the localized source and drain regions, wherein a length of the channel is less than half of a length between the sidewalls.

13. The method of claim 1, wherein forming the gate electrode includes depositing a blanket layer of gate electrode material over the substrate and into the trench, and then polishing the gate electrode material until the gate electrode is substantially aligned with a top surface of the substrate.

14. A method of forming an IGFET, the method comprising the steps of:
   forming a trench partially through a substrate, wherein the trench includes opposing first and second sidewalls and a bottom surface;
   forming an oxide layer on the bottom surface;
   forming first spacers in the trench over outer portions of the oxide layer on the bottom surface, wherein a central portion of the oxide layer on the bottom surface between the first spacers is exposed;
   selectively growing the oxide layer by applying thermal oxidation after forming the first spacers, so that the central portion of the oxide layer is thicker than the outer portions of the oxide layer, and the oxide layer includes a thick region between thin regions on the bottom surface;
   removing the first spacers after selectively growing the oxide layer;
   implanting localized source and drain regions through the thin regions into the substrate using the thick region as an implant mask after removing the first spacers;
   removing the oxide layer after implanting the localized source and drain regions;
   forming a gate insulator on the bottom surface and second spacers on the sidewalls after removing the oxide layer;
   forming a gate electrode on the gate insulator and the second spacers, wherein the gate electrode is in the trench and spaced from and electrically isolated from the substrate;
   implanting sidewall source and drain regions through a top surface of the substrate; and
   forming a source and a drain in the substrate, wherein the source includes the localized source region adjacent to the bottom surface of the trench and the sidewall source region adjacent to the first sidewall, and the drain includes the localized drain region adjacent to the bottom surface of the trench and the sidewall drain region adjacent to the second sidewall.

15. The method of claim 14, including forming the gate insulator after forming the second spacers.

16. The method of claim 14, including implanting the sidewall source and drain regions and the localized source and drain regions simultaneously.

17. The method of claim 14, including implanting the sidewall source and drain regions before implanting the localized source and drain regions.

18. The method of claim 14, including implanting the sidewall source and drain regions after implanting the localized source and drain regions.

19. The method of claim 18, wherein implanting the sidewall source and drain regions after implanting the localized source and drain regions includes using the second spacers and the gate electrode as an implant mask for the bottom surface.

20. The method of claim 14, including implanting the sidewall source and drain regions before forming the trench.

21. The method of claim 14, including implanting the sidewall source and drain regions after forming the trench.

22. The method of claim 14, including implanting the sidewall source and drain regions to a smaller depth than the trench.

23. The method of claim 14, including implanting the sidewall source and drain regions to a greater depth than the trench.

24. The method of claim 14, wherein the localized source and drain regions are lightly doped regions.

25. The method of claim 14, wherein the sidewall source and drain regions are heavily doped regions.

26. The method of claim 14, including forming a channel adjacent to the bottom surface of the trench and between the localized source and drain regions, wherein a length of the channel is less than half of a length between the sidewalls.

27. The method of claim 14, wherein:
the central portion of the oxide layer has planar upper and lower surfaces before selectively growing the oxide layer;
the central portion of the oxide layer has rounded upper and lower surfaces after selectively growing the oxide layer;
the bottom surface is planar before selectively growing the oxide layer; and
the bottom surface includes a rounded indentation adjacent to the lower surface of the central portion of the oxide layer after selectively growing the oxide.

28. The method of claim 27, wherein the central portion of the oxide layer includes all of the thick region and first portions of the thin regions, and the outer portions of the oxide layer include second portions of the thin regions.

29. The method of claim 27, wherein selectively growing the oxide layer causes the oxide layer to lift outer edges of the nitride spacers adjacent to the central portion of the oxide layer.

30. The method of claim 27, wherein selectively growing the oxide layer causes the bottom surface to include a rounded indentation.

31. The method of claim 14, including implanting a channel implant having a same conductivity type as the substrate through the bottom surface after removing the oxide layer, before forming the gate insulator and before forming the second spacers.

32. The method of claim 31, wherein the channel implant includes a threshold adjust implant, a punchthrough implant, and a well implant.

33. The method of claim 14, wherein forming the gate electrode includes depositing a blanket layer of gate electrode material over the substrate and into the trench, and then polishing the gate electrode material until the gate electrode is substantially aligned with the top surface of the substrate.

34. The method of claim 14, wherein substantially all of the gate electrode is within the trench.

35. The method of claim 14, wherein the gate electrode is polysilicon, the gate insulator is silicon dioxide, and the first spacers are silicon nitride.

36. The method of claim 35, wherein the second spacers are silicon dioxide.

37. The method of claim 14, wherein the IGFET is an N-channel MOSFET.

38. The method of claim 14, wherein the IGFET is a P-channel MOSFET.

39. A method of forming an IGFET, the method comprising the following steps in the sequence set forth:
providing a semiconductor substrate of first conductivity type;
patterning a photoresist layer with an opening over the substrate;
applying an anisotropic etch through the opening in the photoresist layer to form a trench partially through the substrate, wherein the trench has first and second opposing sidewalls and a bottom surface;
forming an oxide layer on the sidewalls and the bottom surface, wherein the oxide layer includes sidewall portions on the sidewalls, outer portions on the bottom surface and adjacent to the sidewall portions, and a central portion on the bottom surface between the outer portions;
forming nitride spacers in the trench on the sidewall portions and the outer portions of the oxide layer, wherein the nitride spacers expose the central portion of the oxide layer;
selectively growing the oxide layer by applying thermal oxidation, so that central portion of the oxide layer is thicker than the outer portions of the oxide layer, and the oxide layer includes a thick region between thin regions on the bottom surface;
removing the nitride spacers;
implanting localized source and drain regions through the thin regions into the substrate using the thick region as an implant mask;
removing the oxide layer;
forming second spacers on the sidewalls and on outer portions of the bottom surface, wherein the second spacers expose a central portion of the bottom surface between the outer portions of the bottom surface;
growing a gate oxide on the central portion of the bottom surface;
depositing polysilicon on the gate oxide and the second spacers; and
polishing the polysilicon to form a polysilicon gate electrode in the trench and substantially aligned with a top surface of the substrate, wherein the polysilicon gate electrode is spaced from and electrically isolated from the substrate;
wherein a source of second conductivity type in the substrate includes a sidewall source region merged with the localized source region, a drain of second conductivity type in the substrate includes a sidewall drain region merged with the localized drain region, the sidewall source region is adjacent to the first sidewall and extends between the top and bottom surfaces, the sidewall drain region is adjacent to the second sidewall and extends between the top and bottom surfaces, the localized source and drain regions are adjacent to the bottom surface of the trench, and the localized source and drain regions define a channel in the substrate adjacent to the central portion of the bottom surface of the trench.

40. The method of claim 39, including implanting the sidewall source and drain regions and the localized source and drain regions simultaneously.

41. The method of claim 39, including implanting the sidewall source and drain regions before implanting the localized source and drain regions and before forming the trench.

42. The method of claim 39, including implanting the sidewall source and drain regions after implanting the localized source and drain regions.

43. The method of claim 39, wherein the localized source and drain regions are lightly doped regions and the sidewall source and drain regions are heavily doped regions.

* * * * *

UNITED STATES PATENT AND TRADEMARK OFFICE
CERTIFICATE OF CORRECTION

PATENT NO.   : 5,888,880

DATED        : March 30, 1999

INVENTOR(S)  : Mark I. Gardner, H. Jim Fulford, Jr., Frederick N. Hause

Page 1 of 1

It is certified that error appears in the above-identified patent and that said Letters Patent is hereby corrected as shown below:

Please delete Column 17, lines 1-13; *and*
Please delete Column 18, lines 1-10.

Signed and Sealed this

Eighteenth Day of September, 2001

*Attest:*

*Attesting Officer*

NICHOLAS P. GODICI
*Acting Director of the United States Patent and Trademark Office*